(12) United States Patent
Schwandner et al.

(10) Patent No.: US 8,647,173 B2
(45) Date of Patent: Feb. 11, 2014

(54) METHOD FOR POLISHING A SEMICONDUCTOR WAFER

(71) Applicant: Siltronic AG, Munich (DE)

(72) Inventors: Juergen Schwandner, Garching (DE); Thomas Buschhardt, Burghausen (DE); Roland Koppert, Triftern (DE)

(73) Assignee: Siltronic AG, Munich (DE)

( * ) Notice: Subject to any disclaimer, the term of this patent is extended or adjusted under 35 U.S.C. 154(b) by 0 days.

(21) Appl. No.: 13/792,295

(22) Filed: Mar. 11, 2013

(65) Prior Publication Data

US 2013/0189904 A1 Jul. 25, 2013

Related U.S. Application Data

(62) Division of application No. 12/897,063, filed on Oct. 4, 2010.

(30) Foreign Application Priority Data

Oct. 28, 2009 (DE) .......................... 10 2009 051 007

(51) Int. Cl.
*B24B 1/00* (2006.01)
(52) U.S. Cl.
USPC .................... 451/37; 451/41; 451/57; 451/59; 451/63
(58) Field of Classification Search
USPC ........... 451/36, 41, 57, 59, 63, 286, 287, 289, 451/290, 397, 398
See application file for complete search history.

(56) References Cited

U.S. PATENT DOCUMENTS

| 5,152,917 A | 10/1992 | Pieper et al. |
| 5,267,418 A | 12/1993 | Currie et al. |
| 5,549,511 A | 8/1996 | Cronin |
| 5,672,091 A * | 9/1997 | Takahashi et al. ................ 451/6 |
| 5,897,426 A | 4/1999 | Somekh |
| 5,944,590 A | 8/1999 | Isobe |
| 6,033,292 A | 3/2000 | Inaba |
| 6,074,277 A * | 6/2000 | Arai .................................. 451/8 |
| 6,290,578 B1 * | 9/2001 | Bowman et al. ................ 451/41 |
| 6,293,850 B1 | 9/2001 | Lin et al. |
| 6,340,434 B1 * | 1/2002 | Mizuno et al. .................. 216/38 |
| 6,383,332 B1 * | 5/2002 | Shelton et al. .................... 451/8 |

(Continued)

FOREIGN PATENT DOCUMENTS

| DE | 10196254 T1 | 6/2003 |
| DE | 102007035266 A1 | 1/2009 |

(Continued)

*Primary Examiner* — Timothy V Eley
(74) *Attorney, Agent, or Firm* — Leydig, Voit & Mayer, Ltd.

(57) ABSTRACT

A method of polishing a semiconductor wafer using a holding system including a lined cutout the size of the semiconductor wafer that is fixed to a carrier. The method includes holding the semiconductor wafer in the cutout through adhesion of a first side of the semiconductor wafer to a bearing surface in the cutout and polishing a second side of the held semiconductor wafer using a polishing pad that is fixed on a polishing plate while introducing a polishing agent between the second side of the semiconductor wafer and the polishing pad, the polishing pad including fixedly bonded abrasive materials. The carrier is guided during polishing such that a portion of the second side of the semiconductor wafer temporarily projects beyond a lateral edge of a surface of the polishing pad.

10 Claims, 1 Drawing Sheet

(56) References Cited

U.S. PATENT DOCUMENTS

| | | |
|---|---|---|
| 6,422,927 B1 | 7/2002 | Zuniga |
| 6,435,945 B1 | 8/2002 | Somekh |
| 6,602,117 B1 | 8/2003 | Chopra et al. |
| 6,609,950 B2 * | 8/2003 | Kimura et al. ............... 451/5 |
| 6,645,044 B2 | 11/2003 | Zuniga |
| 6,913,513 B2 * | 7/2005 | Kimura et al. ............... 451/6 |
| 7,037,403 B1 * | 5/2006 | Tang ..................... 156/345.16 |
| 7,582,221 B2 | 9/2009 | Netsu et al. |
| 2002/0069967 A1 | 6/2002 | Wright |
| 2003/0022495 A1 * | 1/2003 | Netsu et al. ............... 438/689 |
| 2003/0181141 A1 | 9/2003 | Taniguchi et al. |
| 2005/0227590 A1 | 10/2005 | Sung |
| 2006/0258268 A1 | 11/2006 | Miyata et al. |
| 2008/0020683 A1 * | 1/2008 | Doi et al. ..................... 451/259 |
| 2009/0029552 A1 | 1/2009 | Schwandner et al. |
| 2009/0057840 A1 | 3/2009 | Netsu et al. |
| 2009/0191791 A1 * | 7/2009 | Fukushima et al. ............ 451/9 |
| 2010/0104806 A1 | 4/2010 | Schwandner |
| 2010/0233945 A1 * | 9/2010 | Masumura et al. .......... 451/364 |

FOREIGN PATENT DOCUMENTS

| | | |
|---|---|---|
| DE | 102008053610 A1 | 7/2010 |
| EP | 1029633 A1 | 8/2000 |
| EP | 1050369 A2 | 11/2000 |
| EP | 1261020 A1 | 11/2002 |
| EP | 1717001 A1 | 11/2006 |
| JP | 2003188126 A | 7/2003 |
| JP | 2003188127 A | 7/2003 |
| JP | 2004107644 A | 4/2004 |
| JP | 2007274012 A | 10/2007 |
| WO | WO 9213680 A | 8/1992 |
| WO | WO 9955491 A1 | 11/1999 |
| WO | WO 03074228 A1 | 9/2003 |

* cited by examiner

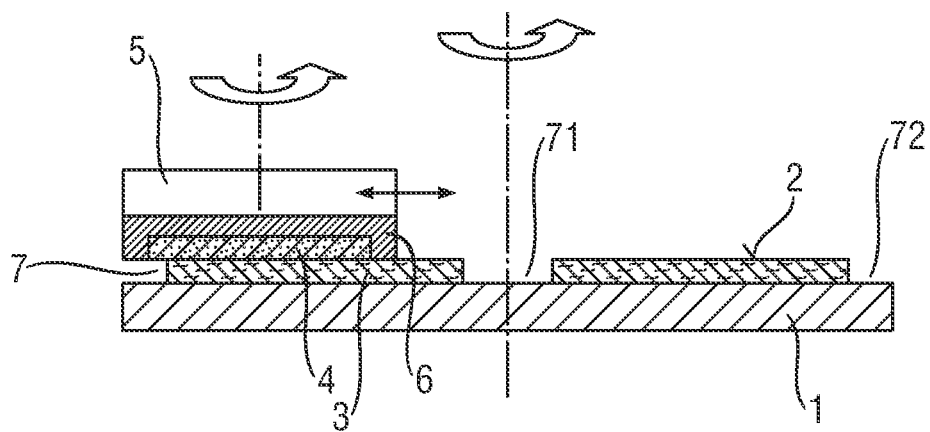
A
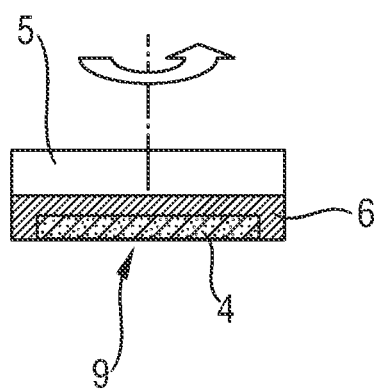
B
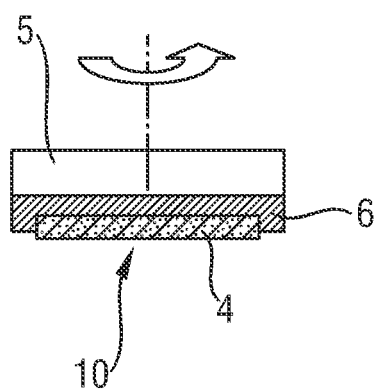

METHOD FOR POLISHING A SEMICONDUCTOR WAFER

CROSS REFERENCE TO RELATED APPLICATIONS

This application is a divisional application of U.S. patent application Ser. No. 12/897,063 filed Oct. 4, 2010, which claims priority to German Patent Application No. 10 2009 051 007.9, filed on Oct. 28, 2009, each of which is incorporated by reference herein in its entirety.

FIELD

The invention relates to a method for the double-side polishing of a semiconductor wafer.

BACKGROUND

Conventional methods of polishing both sides of a semiconductor wafer include the use of a polishing pad with a supply of a polishing agent as stock removal polishing (DSP step), and a final polishing only of the front side ("component side") using a softer polishing pad as so-called haze-free polishing (CMP step, "finishing"), but also include new so-called "fixed abrasive polishing" (FAP) technologies, in which the semiconductor wafer is polished on a polishing pad which contains an abrasive material bonded in the polishing pad ("fixed-abrasive pad"). A polishing step in which such an FAP polishing pad is used is referred to hereinafter for short as FAP step.

WO 99/55491 A1 describes a two-stage polishing method, comprising a first FAP polishing step and a subsequent second CMP polishing step. In the case of CMP, the polishing pad contains no bonded abrasive material. In this case, as in the case of a DSP step, abrasive material is introduced in the form of a slurry between the semiconductor wafer and the polishing pad. Such a two-stage polishing method is used in particular to eliminate scratches left by the FAP step on the polished surface of the substrate.

EP 1 717 001 A1 is one example of the fact that FAP steps are also used when polishing semiconductor wafers which have not yet had any component structures formed on their surface. During the polishing of such semiconductor wafers, it is primarily important to produce at least one lateral surface which is particularly planar and which has a minimal microroughness and nanotopography.

US 2002/00609967 A1 relates to CMP methods for leveling topographic surfaces during the production of electronic components. The primary endeavor is to alleviate the disadvantage of comparatively low removal rates when using FAP polishing pads. A sequence of polishing steps is proposed wherein polishing is effected firstly using an FAP pad in conjunction with a polishing agent slurry and subsequently using an FAP pad in conjunction with a polishing agent solution. In this case, the order of the steps is chosen in a targeted manner in order to increase the removal rate. The polishing of wafers composed of material having a homogeneous composition, e.g. silicon wafers, is not described therein.

WO 03/074228 A1, too, describes a method for leveling topographic surfaces during the production of electronic components. In this case, the central point of the description is the endpoint recognition in CMP methods. As is known, endpoint recognition involves ending the polishing and hence the material removal in a timely fashion before regions are removed which are specifically not intended to be polished. A two-stage method for polishing a copper layer is proposed for this purpose. In the first step, polishing is effected using an FAP polishing pad, wherein the polishing agent optionally does or does not contain free abrasive particles. In the second polishing step of this method, in which polishing is likewise effected using an FAP pad, the use of a polishing agent with free abrasive particles is, in contrast, essential.

DE 102 007 035 266 A1 describes a method for polishing a substrate composed of semiconductor material, comprising two polishing steps of the FAP type, which differ in that, in one polishing step, a polishing agent slurry containing non-bonded abrasive material as a solid is introduced between the substrate and the polishing pad, while in the second polishing step the polishing agent slurry is replaced by a polishing agent solution that is free of solids.

The conventional polishing methods, in particular the DSP polishing, lead to an unfavorable edge symmetry, in particular to a so-called "edge roll-off", that is to say to an edge decrease relative to the thickness of the semiconductor wafer.

In principle, the semiconductor wafers are pressed with the aid of a polishing head with their lateral surface to be polished against the polishing pad lying on a polishing plate.

A polishing head also includes a retainer ring, which encloses the substrate laterally and prevents it from sliding off the polishing head during the polishing. Therefore, in order to prevent the transverse forces which occur during the polishing from pushing the wafer from the polishing head, the wafers are held in position by such retainer rings. These devices are described in various patents (U.S. Pat. No. 6,293,850B1; U.S. Pat. No. 6,033,292; EP 1029633A1; U.S. Pat. No. 5,944,590).

The retainer rings are pressed more or less firmly onto the polishing pad.

In modern polishing heads, that lateral surface of the semiconductor wafer which is remote from the polishing pad bears on an elastic membrane which transmits the polishing pressure exerted. The membrane is part of a chamber system, subdivided if appropriate, which can form a gas or liquid cushion (membrane carrier, zone carrier).

The pressure chambers are preferably arranged concentrically or in segmented fashion, and a specific pressure can be applied to them separately from one another. The polishing pressure is finally transmitted to the rear side of a support plate via elastic bearing surfaces of the pressure chambers to which pressure is applied. This applies for example to the multi-plate polishing machine AMAT Reflection from Applied Materials, Inc., which comprises a 5-zone membrane carrier with a differently adjustable pressure profile.

In the case of DSP and CMP, the substrate is polished with supply of a polishing agent between the substrate and the polishing pad and with rotation of the polishing head and the polishing plate.

The German application—not previously published—bearing the file reference 102008053610.5 describes a method for the double-side polishing of a semiconductor wafer, comprising the following steps in the stated order:

a) polishing of a rear side of the semiconductor wafer on a polishing pad which contains an abrasive material bonded in the polishing pad, wherein a polishing agent solution that is free of solids is introduced between the rear side of the semiconductor wafer and the polishing pad during the polishing step;

b) stock removal polishing of the front side of the semiconductor wafer on a polishing pad which contains an abrasive material bonded in the polishing pad, wherein a polishing agent solution that is free of solids is introduced between the front side of the semiconductor wafer and the polishing pad during the polishing step;

c) removal of the microroughness from the front side of the semiconductor wafer by polishing of the front side of the semiconductor wafer on a polishing pad, wherein a polishing agent slurry containing abrasive materials is introduced between the front side of the semiconductor wafer and the polishing pad during the polishing step;

d) final polishing of the front side of the semiconductor wafer by polishing of the front side of the semiconductor wafer on a polishing pad which contains no abrasive material bonded in the polishing pad, wherein a polishing agent slurry containing abrasive materials is introduced between the front side of the semiconductor wafer and the polishing pad during the polishing step.

Steps a) and b) of this method are FAP polishing steps. Step c) can also be carried out in the form of an FAP polishing step, that is to say using a polishing pad comprising fixedly bonded abrasives. Step d) is a typical CMP polishing step.

This method makes it possible to improve the nanotopography of the semiconductor wafer and the edge geometry thereof The DSP step provided in the prior art can be obviated.

On searching for a further improvement in the edge geometry of the semiconductor wafers polished according to this method, the inventors have recognized that, particularly in the case of FAP polishing steps using comparatively hard and stiff FAP polishing pads, the polishing machines and wafer holding systems usually used are in part disadvantageous. This is due to the fact that the hard FAP polishing pads scarcely "yield", i.e. react only inadequately to pressure from outside (pressure in AMAT 5-zone carrier, retainer ring contact pressure).

SUMMARY

The above realization gave rise to embodiments of the present invention.

In an embodiment, the present invention provides a method of polishing a semiconductor wafer using a holding system including a lined cutout the size of the semiconductor wafer that is fixed to a carrier. The method includes holding the semiconductor wafer in the cutout through adhesion of a first side of the semiconductor wafer to a bearing surface in the cutout and polishing a second side of the held semiconductor wafer using a polishing pad that is fixed on a polishing plate while introducing a polishing agent between the second side of the semiconductor wafer and the polishing pad, the polishing pad including fixedly bonded abrasive materials. The carrier is guided during polishing such that a portion of the second side of the semiconductor wafer temporarily projects beyond a lateral edge of a surface of the polishing pad.

In another embodiment, the present invention provides a method of double-side polishing a semiconductor wafer that includes several steps in following order:

a) polishing a rear side of the semiconductor wafer using a polishing pad that is fixed on a polishing plate and that contains fixedly bonded abrasive materials while introducing a polishing agent solution that is free of solids between the rear side of the semiconductor wafer and the polishing pad, b) stock removal polishing a front side of the semiconductor wafer using a polishing pad that is fixed on a polishing plate ant that contains fixedly bonded abrasive materials while introducing a polishing agent solution that is free of solids between the front side of the semiconductor wafer and the polishing pad, c) removing microroughness from the front side of the semiconductor wafer by polishing the front side of the semiconductor wafer using a polishing pad that is fixed on a polishing plate while introducing a polishing agent slurry containing abrasive materials between the front side of the semiconductor wafer and the polishing pad, and d) final polishing of the front side of the semiconductor wafer using a polishing pad that is fixed on a polishing plate and that contains no abrasive material bonded therein while introducing a polishing agent slurry containing abrasive materials.

During at least each of a) through c) the semiconductor wafer is held in a holding system fixed to a carrier, the holding system including a bearing surface and a lined cutout that is the size of the semiconductor wafer, the semiconductor wafer being held through adhesion of the side that is not being polished to the bearing surface. During a) through c) the carrier is guided such that at least a portion of the respective side that is being polished temporarily projects beyond a lateral edge of the respective polishing pad.

BRIEF DESCRIPTION OF THE DRAWINGS

Exemplary embodiments are described in further detail below with reference to the drawings, in which:

FIG. 1 illustrates excursion of a semiconductor wafer during a polishing method;

FIG. 1A illustrates the phenomenon of wafer underhang; and

FIG. 1B illustrates the phenomenon of wafer overhang.

DETAILED DESCRIPTION

Holding systems having cutouts for receiving a semiconductor wafer as described above and in the following are also referred to as templates.

In an embodiment, the present invention provides for carrying out polishing using polishing pads comprising fixedly bonded abrasives in a polishing machine with a carrier system with a template and workpiece excursion.

In one embodiment, the cutout in the template may be delimited by a ring in which the semiconductor wafer is held and guided. However, in contrast to conventional retainer rings, this ring is not pressed against the polishing pad with a contact pressure. Moreover, the holding system comprises no pressure chambers whatsoever to which pressure is applied. The object cannot be achieved with such holding systems.

Moreover, the semiconductor wafer is not cemented onto the holding system, but rather may be held through adhesion.

That side of the semiconductor wafer which is remote from the polishing pad may be held on a support pad or bearing surface. This pad forming the bearing surface is often also referred to as a backing pad. This designation will also be used in the description that now follows. Therefore, that side of the semiconductor wafer which is not to be polished preferably does not bear directly on the template or the lower surface of the cutout in the template, but rather on a separate pad with which the cutout in the template is lined. Instead of a pad, the surface of the cutout in the template can, of course, also be coated with a suitable material, such that the term that shall be employed in this case is a backing pad layer, rather than a pad. Moreover, the template can be composed of one material and the surface of the template, in particular the surface of the cutout, can be correspondingly processed, thus resulting in the desired properties of the "backing pad". Thus, template and backing pad can also be composed of one and the same material and be configured in one piece. Suitable materials for templates and backing pads are explained below.

The holding system may be fixed on a support plate or carrier baseplate, which has a planar, concave or a convex form and which is connected to the polishing head. This means that there is no difference relative to conventional systems, in which the membrane carriers, zone carriers are likewise applied on such support plates. The entire support plate can easily be disassembled from the polishing machine such that the mounting of the holding system on the support plate can take place outside the polishing machine, which is preferred. The support plate is often also referred to as "backing plate".

The designation "pocket" is also customary for the cutouts in the templates.

Accordingly, the depth of the cutout is often specified as pocket depth. It essentially corresponds to a thickness of the ring preferably surrounding the cutout.

Suitable templates are disclosed for example in JP2003188126, JP2003188127, U.S. Pat. No. 5,267,418 and U.S. Pat. No. 5,549,511, which are incorporated by reference herein in their entirety.

There are commercially available templates for single-side polishing machines which, depending on the application, are composed of different materials and are present with different sizes and are equipped with different pocket depths, for example from Zeromicron® Inc. or from PR Hoffman or from Nagase & Co. Ltd.

By way of example, it is possible to produce templates from epoxy-resin-reinforced fiberglass or from polyethylene terephthalate (PET).

The template can be present in porous or non-porous form.

The backing pad of the template or the template itself preferably comprises a pressure-sensitive adhesive (PSA).

The backing pad preferably comprises a soft material, e.g. a polyurethane having a hardness of 20-90 according to Shore A. The PSA layer can be applied to said polyurethane.

The backing pad material may be viscous and elastic.

Furthermore, in particular acrylate or polyacrylate resins, acrylic rubber, styrene-based resins such as polystyrene-polyisoprene-polystyrene (SIS) block copolymers, natural rubber with resin compositions are suitable as backing pad material.

Mixtures containing a thermoplastic elastomer such as styrene block copolymers, polystyrene-poly(ethylene/butylene)-polystyrene (S-EB-S) or S-I-S block copolymers, and a polar, hydrophilic resin such as polyvinyl alkyl ether, polyvinylpyrrolidone, polyethyloxazolidine, polyvinyl alcohol or polyacrylic acid copolymer, natural resin or natural resin esters or esters of polymerized natural resins are furthermore suitable.

A template having a smooth or rough surface can be chosen as required.

The template may have a retainer ring which surrounds the cutout in the template and encloses the semiconductor wafer. This involves a type of retainer ring which holds the semiconductor wafer in position and presses it more or less firmly onto the polishing pad in order to prevent the transverse forces which occur during polishing from pushing the semiconductor wafer from the polishing head, as described in U.S. Pat. No. 6,293,850 B1, U.S. Pat. No. 6,033,292, EP 1029633 A1 or U.S. Pat. No. 5,944,590, but without provision of a retainer ring contact pressure as in conventional systems.

As already mentioned above, carriers which have pressure chambers which are arranged concentrically or in segmented fashion and to which pressure is applied, and which transmit said pressure to the rear side of the support plate via elastic bearing surfaces of the pressure chambers, are not used in embodiments of the invention.

The template is preferably fitted on the carrier baseplate in such a way that it can easily be exchanged. Preferably, it is adhesively bonded onto the carrier baseplate. For this purpose, the template may comprise a self-adhesive layer.

The semiconductor wafer is held on the backing pad by means of adhesion.

In this case, depending on the backing pad used, it may be necessary for the surface of the backing pad on which the semiconductor wafer is held to be moist.

The backing pad can be moistened with deionized water.

The backing pad can also be treated with a brush after moistening, e.g. with a brush composed of nylon. Nylon is a trade name for synthetic fibers composed of polyamide.

With the use of PSA, it is not necessary for the backing pad to be moistened in order to activate the adhesion.

During processing, the semiconductor wafers temporarily project with part of their area beyond the edge of the polishing pad or beyond the surface of the polishing pad fixed on the polishing plate. This temporary projection of the workpieces with part of their area is referred to as "workpiece excursion".

FIG. 1 schematically shows what should be understood by the excursion of the semiconductor wafer.

Excursion 7 means that the semiconductor wafer 4 is guided over the edges of the polishing pad 3 in order that the entire width of the polishing pad surface 2 is subjected to loading. The formation of wear edges can thereby be prevented.

Preferably, the excursion amounts to approximately 20% through to 100% of the radius of the semiconductor wafer.

However, it is not absolutely necessary that an excursion has to be present on the inner side 71 and on the outer side 72.

The semiconductor wafer 4 is guided and held by a carrier 5 provided with a template 6.

Furthermore, it is not absolutely necessary for the area of the FA polishing pad surface 2 to be identical to the area of polishing plate 1.

The polishing plate 1 can also take up a larger area and serves for holding the polishing pad.

With the use of polishing pads containing fixedly bonded abrasives, this has proved to be advantageous since the contact area between semiconductor wafer and polishing pad and hence the effective processing pressure fluctuate as a result of the workpiece movement beyond the edge of the polishing pad lining. Furthermore, the wafer area undergoing excursion is drawn from the material removal process at times.

The maximum width of the excursion is determined by the design of the geometry of the holding system, but the temporal duration in the process is determined by the kinematic parameters.

Various pocket depths can be presented in conjunction with the excursion.

If the pocket depth is smaller than the wafer thickness, then the term employed is wafer overhang 10 (see FIG. 1B); by contrast, if it is greater than or equal to said wafer thickness, then the term employed is wafer underhang 9 (see FIG. 1A).

Through the combination of excursion with variable pocket depth of the cutout in the template, it is possible to influence the polishing removal in the region of the wafer edge in a targeted manner and thus to bring about an improvement in the wafer edge geometry.

The polishing agent solution in accordance with steps a) and b) of the second method according to the invention is, in the simplest case, water, preferably deionized water (DIW) having the purity customary for use in the semiconductor industry.

However, the polishing agent solution can also contain compounds such as sodium carbonate ($Na_2CO_3$), potassium carbonate ($K_2CO_3$), sodium hydroxide (NaOH), potassium hydroxide (KOH), ammonium hydroxide ($NH_4OH$), tetramethylammonium hydroxide (TMAH) or any desired mixtures thereof. The use of potassium carbonate is especially preferred. In this case, the pH value of the polishing agent solution preferably lies in a range of 10 to 12 and the proportion of the stated compounds in the polishing agent solution is preferably 0.01 to 10% by weight, particularly preferably from 0.01 to 0.2% by weight.

The polishing agent solution can furthermore contain one or more further additives, for example surface-active additives such as wetting agents and surfactants, stabilizers acting as protective colloids, preservatives, biocides, alcohols and complexing agents.

Between steps b) and c), a further FAP step may be effected using a polishing agent slurry as in step c), but with an FAP pad.

The proportion of the abrasive material in the polishing agent slurry in accordance with steps c) and d) of the method according to the invention is preferably 0.25 to 20% by weight, particularly preferably 0.25 to 1% by weight.

The size distribution of the abrasive material particles may be monomodal in nature.

The average particle size is 5 to 300 nm, particularly preferably 5 to 50 nm.

The abrasive material comprises a material that mechanically removes the substrate material, for example one or more of the oxides of the elements aluminum, cerium or silicon.

A polishing agent slurry containing colloidally disperse silica can be used (silica sol, cf. Table 1 and associated description; "Glanzox").

The pH value of the polishing agent slurry preferably may lie in a range of 9 to 11.5 and can be set by additives such as sodium carbonate ($Na_2CO_3$), potassium carbonate ($K_2CO_3$), sodium hydroxide (NaOH), potassium hydroxide (KOH), ammonium hydroxide ($NH_4OH$), tetramethylammonium hydroxide (TMAH) or any desired mixtures of these compounds. The use of potassium carbonate is possible.

The polishing agent slurry can furthermore contain one or more further additives, for example surface-active additives such as wetting agents and surfactants, stabilizers acting as protective colloids, preservatives, biocides, alcohols and complexing agents.

Simultaneous polishing of front and rear sides at the same time (DSP) is not the subject matter of the invention. According to embodiments of the invention, in each case only one side of the semiconductor wafer is processed in each processing step.

Furthermore, the method according to embodiments of the invention can equally be carried out on single-plate and multi-plate polishing machines.

The use of multi-plate polishing machines having two, or three, polishing plates and polishing heads may be used.

Different polishing pads and different polishing agents can also be used in this case.

In the method according to an embodiment of the invention, a polishing pad containing an abrasive material bonded in the polishing pad (FAP or FA pad) is used in each case in steps a) and b).

Suitable abrasive materials comprise for example particles of oxides of the elements cerium, aluminum, silicon, zirconium and particles of hard materials such as silicon carbide, boron nitride and diamond.

Particularly suitable polishing pads have a surface topography shaped by replicated microstructures. These microstructures ("posts") have for example the form of columns having a cylindrical or polygonal cross section or the form of pyramids or truncated pyramids.

More detailed descriptions of such polishing pads are contained for example in WO 92/13680 A1 and US 2005/227590 A1, which are incorporated by reference herein.

The use of cerium oxide particles bonded in the polishing pad is preferred, cf. also U.S. Pat. No. 6,602,117B1, which is incorporated by reference herein.

The average particle size of the abrasives contained in the FAP polishing pad may be 0.1-1.0 μm, particularly 0.1-0.6 μm, and preferably 0.1-0.25 μm.

A stock removal polishing pad may be used in step c). What is suitable for this purpose is, by way of example, a polishing pad from the SUBA™ series from Rohm & Haas, e.g. the SUBA™ 1250 ("stock pad"), or a typical CMP polishing pad ("finishing pad") such as the SPM 3100 from Rodel®.

However, an FAP polishing pad as in step b) of the method according to the invention can also be involved, that is to say a polishing pad which, in contrast to the stock removal and CMP polishing pads, contains bonded abrasive material.

In processing steps b) and c), therefore, the same polishing pad can be involved or different polishing pads can be used. An FAP polishing pad can therefore be used in step c). However, it is also preferred to use a CMP polishing pad.

In step d), a CMP polishing pad is used, e.g. the SPM 3100 from Rodel®, which contains no bonded abrasives. Step d) corresponds to a conventional CMP polishing step.

In a final phase of the polishing, 5 to 300 s before the substrate is lifted from the polishing plate, the polishing pressure may be reduced by at least 10% with the substrate continuing to be polished with this reduced polishing pressure until lifted off from the polishing plate.

It is likewise possible to clean the polishing pad with a cleaning agent by distributing the cleaning agent on the polishing pad with the aid of an open-pored foam body. This is preferably done in situ, that is to say during the polishing of the substrate. The pad cleaning differs from a pad conditioning by virtue of the fact that the foam body does not contain any abrasive materials bonded thereto. In principle, any elastic plastic foam having an open cell structure is suitable, for example polyurethane foams, polyvinyl alcohol foams, polystyrene foams, silicone foams, epoxy foams, urea-formaldehyde foams, polyimide foams, polybenzimidazole foams, foams based on phenolic resins, polyethylene foams, polypropylene foams, polyacrylic foams, polyester foams and viscose foams. The polishing agent used in the respective polishing step is suitable, in particular, as cleaning agent.

Sequential application—relative to the respective side of the wafer (front side or rear side)—of polishing based on fixed abrasive polishing technology, using a template holding system with workpiece excursion is important in embodiments of the invention.

The wafer edge can thereby be influenced in a targeted manner in order thus to set the desired geometry properties of the polished semiconductor wafer. The two polishing steps, that is to say the rear-side polishing and the front-side polishing, can be coordinated with one another such that even more targeted influencing of the wafer geometry and wafer nanotopology can be performed in this way.

Furthermore, when such sequential polishing is carried out on a multi-plate single-side polishing machine, for which purpose the "Reflection" type from Applied Materials or the "PW 300 Apollo" type from Peter Wolters, Rendsburg, is suitable, for example, an upstream typical DSP polishing step can then be obviated since both the geometry-determining polishing and the nanotopology-determining polishing are carried out completely on one and the same machine type.

If the polishing both of the wafer rear side and of the wafer front side is effected completely on one polishing machine, provision is made of a device for rotating the wafers on or in the machine. Such devices are known in the wafer industry.

An intermediate step for geometry measurement may be provided after a first polishing of the rear side of the semiconductor wafer. The polishing of the front side of the semiconductor wafer is then adapted on the basis of the geometry measurement.

In accordance with embodiments of the invention, the outer wafer edge region can be influenced in a targeted manner. This leads to an improvement in the local geometry in a range of less than or equal to 2 mm edge exclusion, in particular of less than or equal to 1 mm edge exclusion.

The polishing sequence can be significantly simplified. In particular for the latest generation of wafers having a diameter of 450 mm, the method according to the invention thus affords significant advantages with regard to product costs as well.

In particular, the complete polishing of the semiconductor wafer can be carried out on one type of polishing machine by means of a combined polishing method. Both the stock removal polishing and the haze-free polishing take place on the same type of polishing machine. The DSP process customary heretofore is obviated.

It has been shown that the use of a carrier with a template and the realization of a workpiece excursion in combination with the use of stiff, inelastic and hard polishing pads can be used.

Therefore, the combination of single-side polishing, FA polishing pad, template carrier system and workpiece excursion is advantageous.

The edge roll-off, that is to say the decrease in thickness toward the edge of the semiconductor wafer, can be reduced.

EXAMPLE

All the polishing processes presented below are carried out using a whole-area carrier (no membrane carrier, no multi-zone carrier) equipped with a template.

The carrier baseplate itself can have a planar, convex or concave form.

A 3-plate polishing machine such as the AMAT Reflection from Applied Materials, Inc. is used as the polishing machine.

A. Polishing of the rear side of the semiconductor wafer with workpiece excursion:

Use of an FA polishing pad with an average particle size of the abrasive of 0.5 µm. The supply of an abrasive-free polishing agent, e.g. dilute $K_2CO_3$.

A second partial polishing step for the rear side of the semiconductor wafer is optionally effected on the same polishing pad, but with the supply of a silica sol, e.g. Glanzox 3900, in order to set the roughness of the wafer rear side in a targeted manner.

B. Polishing of the front side of the semiconductor wafer in three steps:

B.1. Plate 1 equipped with FAP polishing pad, supply of a dilute alkaline solution, for example based on $K_2CO_3$ B.2. Plate 2 equipped with stock removal polishing pad (e.g. Suba 1250), supply of a polishing agent containing abrasives, preferably silica sol and alkaline solution.

B.3. Plate 3: typical CMP haze-free polishing, CMP polishing pad (e.g. SPM 3100) and CMP polishing agent.

What is suitable for this purpose is, by way of example, a polishing pad from the SUBA™ series from Rohm & Haas, e.g. the SUBA™ 1250 ("stock pad"), or a typical CMP polishing pad ("finishing pad") such as the SPM 3100 from Rodel®.

Commercially available polishing pads are e.g. the SPM 3100 from Rodel Inc. or the pads of the DCP series and also the pads of the brands IC1000™, Polytex™ or SUBA™ from Rohm & Hass.

As an alternative to B.2., the polishing of the front side of the semiconductor wafer can be carried out by means of a 2-stage polishing process. In this case, the polishing step B.2. and the CMP polishing B.3. take place on one and the same polishing pad.

If a CMP polishing pad is used in steps B.2. and B.3., the following procedure is preferred:

In step B.2., a silica sol having a higher solids concentration, e.g. Levasil 200, is supplied in a pH range of greater than or equal to 11, in order to ensure a higher removal rate. This step serves to eliminate the microdamage.

The LEVASIL® products from H.C. Starck are colloidal dispersions of silicon dioxide particles and are produced and supplied up to a concentration of 50% depending on the type.

During the CMP polishing, a typical CMP polishing agent such as Glanzox 3900 is supplied, having a pH value of 10 to at most 11. This step with a low removal rate serves for producing a surface polished in haze-free fashion.

Glanzox 3900 is the product name for a polishing agent slurry offered as a concentrate by Fujimi Incorporated, Japan. The concentrate having a pH of 10.5 contains approximately 9% by weight of colloidal $SiO_2$ having an average particle size of 30 to 40 nm.

If a stock removal polishing pad is used in steps B.2. and B.3., the following procedure is preferred:

In step B.2., a silica sol having a higher solids concentration, e.g. Levasil 200, is supplied in a pH range of greater than or equal to 11. The polishing duration is significantly reduced. This step serves to eliminate the microdamage with an increased removal rate.

During the CMP polishing, a typical CMP polishing agent such as Glanzox 3900 is supplied, having a pH value of 10 to at most 11. The polishing time during CMP is increased owing to a lower removal rate. This step serves to produce a surface polished in haze-free fashion.

The process can be realized on one and the same polishing machine—here a 3-plate polishing machine of the Reflection type (AMAT Corp.):

AMAT Reflection (3-plate polishing machine) for polishing the rear side on plate 1→then turn semiconductor wafer→then 3-plate polishing of the front side (plate 1, plate 2, plate 3).

Plate 1: FAP polishing pad; $K_2CO_3$ solution (dilute); Glanzox 3900

Plate 2: e.g. Suba 1250 polishing pad and standard removal polishing agent; Glanzox 3900

Plate 3: e.g. SPM 3100 polishing pad and Glanzox 3900

We claim:

1. A method of double-side polishing a semiconductor wafer, the method comprising the following steps in the recited order:

a) polishing a rear side of the semiconductor wafer using a polishing pad that is fixed on a polishing plate and that contains fixedly bonded abrasive materials while introducing a polishing agent solution that is free of solids between the rear side of the semiconductor wafer and the polishing pad;

b) stock removal polishing a front side of the semiconductor wafer using a polishing pad that is fixed on a polishing plate and that contains fixedly bonded abrasive materials while introducing a polishing agent solution that is free of solids between the front side of the semiconductor wafer and the polishing pad;

c) removing microroughness from the front side of the semiconductor wafer by polishing the front side of the semiconductor wafer using a polishing pad that is fixed on a polishing plate while introducing a polishing agent slurry containing abrasive materials between the front side of the semiconductor wafer and the polishing pad; and d) final polishing the front side of the semiconductor wafer using a polishing pad that is fixed on a polishing plate and that contains no abrasive material bonded in the polishing pad while introducing a polishing agent slurry containing abrasive materials, wherein during each of at least steps a) to c) the semiconductor wafer is held in a holding system fixed to a carrier, the holding system including a bearing surface and a lined cutout that is the size of the semiconductor wafer, the semiconductor wafer being held through adhesion of the respective side that is not being polished to the bearing surface, and the carrier is guided such that at least a portion of the respective side that is being polished temporarily projects beyond a lateral edge of the respective polishing pad.

2. The method of polishing recited in claim 1 wherein the cutout of the holding system is delimited by a ring, and wherein the holding system does not include pressure chambers to which pressure can be applied and the holding system is configured such that the ring is not pressed against the polishing pad with a contact pressure.

3. The method of polishing recited in claim 1, wherein the bearing surface includes a pressure-sensitive adhesive.

4. The method of polishing recited in claim 1, wherein the bearing surface comprises a soft material.

5. The method of polishing recited in claim 1, wherein the bearing surface is polyurethane having a hardness of 20-90 according to Shore A.

6. The method of polishing recited in claim 1, further comprising moistening the bearing surface before the holding of the semiconductor wafer in the cutout.

7. The method of polishing as recited in claim 1 wherein the temporary projecting of the second side of the semiconductor wafer beyond the lateral edge of the surface of the respective polishing pad is performed so as to achieve comprehensive utilization of an entirety of the surface of the respective polishing pad during polishing.

8. The method of polishing as recited in claim 1, wherein the polishing pad used in step c) contains bonded abrasive material.

9. The method of polishing as recited in claim 1, wherein the polishing pad used in step c) contains no bonded abrasive material.

10. The method of polishing as recited in claim 1, wherein the fixedly bonded abrasive material of the respective polishing pad used in steps a) and b) include at least one of cerium oxide, aluminum oxide, silicon oxide, zirconium oxide, silicon carbide, boron nitride and diamond.

* * * * *